(12) United States Patent
Kudymov (10) Patent No.: US 9,136,364 B2
(45) Date of Patent: Sep. 15, 2015

(54) FIELD EFFECT TRANSISTOR WITH ACCESS REGION RECHARGE

(75) Inventor: Alexey Kudymov, Branchburg, NJ (US)

(73) Assignee: Power Integrations, Inc., San Jose, CA (US)

( * ) Notice: Subject to any disclaimer, the term of this patent is extended or adjusted under 35 U.S.C. 154(b) by 165 days.

(21) Appl. No.: 12/882,407

(22) Filed: Sep. 15, 2010

(65) Prior Publication Data

US 2011/0062495 A1     Mar. 17, 2011

Related U.S. Application Data

(60) Provisional application No. 61/242,869, filed on Sep. 16, 2009.

(51) Int. Cl.
| | |
|---|---|
| *H01L 29/66* | (2006.01) |
| *H01L 29/778* | (2006.01) |
| *H01L 29/32* | (2006.01) |
| *H01L 29/06* | (2006.01) |
| *H01L 29/20* | (2006.01) |

(52) U.S. Cl.
CPC ............ *H01L 29/7789* (2013.01); *H01L 29/32* (2013.01); *H01L 29/0665* (2013.01); *H01L 29/2003* (2013.01)

(58) Field of Classification Search
CPC ........................ H01L 29/2003; H01L 29/7786
USPC .......... 257/192, 217, 224, 235, 242, E29.246, 257/E29.252
See application file for complete search history.

(56) References Cited

U.S. PATENT DOCUMENTS

| | | | |
|---|---|---|---|
| 5,192,986 A * | 3/1993 | Ando | 257/192 |
| 6,307,232 B1 | 10/2001 | Akiyama et al. | |
| 6,507,051 B1 * | 1/2003 | Hara | 257/194 |
| 7,525,178 B2 | 4/2009 | Kulinsky | |
| 7,777,305 B2 * | 8/2010 | Kuroda et al. | 257/624 |
| 8,569,842 B2 | 10/2013 | Weis et al. | |
| 2010/0163987 A1 | 7/2010 | Nakagawa | |
| 2011/0103148 A1 | 5/2011 | Bhalla et al. | |
| 2011/0114997 A1 | 5/2011 | Wu et al. | |
| 2011/0221011 A1 | 9/2011 | Bahat-Treidel et al. | |
| 2012/0018735 A1 | 1/2012 | Ishii | |

(Continued)

OTHER PUBLICATIONS

Tipimeni, Koudymov, Adivarahan, Yang, Simin, Khan, "The 1.6 kV AlGaN/GaN HFETs", IEEE Electron Device Letters, V. 27, N9, 716-718, Sep. 2006.

(Continued)

*Primary Examiner* — Jay C Kim
(74) *Attorney, Agent, or Firm* — Blakely Sokoloff Taylor & Zafman LLP (57) ABSTRACT

The current invention provides the design of the field effect transistor with lateral channel suitable for high voltage switching. In such a transistor, the electrical charge stored in the high electric field region has to vary as the transistor switches from ON to OFF state and back. The invention provides the method of calculating the necessary recharging path parameters based on the material parameters of the FET and desired blocking voltage, ON state resistance and switching speed. The invention can be used in power electronics by providing circuits and parts, for example, for electrical power distribution between power plant customers, for automotive, craft and space applications and many other applications where high voltage in excess of 400-600 V is involved.

3 Claims, 11 Drawing Sheets

(56) References Cited

U.S. PATENT DOCUMENTS

| | | |
|---|---|---|
| 2012/0153361 A1 | 6/2012 | Ahn et al. |
| 2012/0217544 A1 | 8/2012 | Ohki |
| 2012/0217581 A1 | 8/2012 | Kondou |
| 2013/0127521 A1 | 5/2013 | Simin et al. |
| 2014/0001479 A1 | 1/2014 | Kudymov |
| 2014/0001515 A1 | 1/2014 | Kudymov |

OTHER PUBLICATIONS

Tipimeni, Adivarahan, Simin, Khan, "SiO2-Encapsulated High Voltage AlGaN/GaN HFETs for Power-Switching Applications", IEEE Electron Device Letters, V. 28, No. 9, pp. 784-786, Sep. 2007.

Karmalkar and Soudabi, "A Closed-Form Model of the Drain-Voltage Dependence of the OFF-State Channel Electric Field in a HEMT with a Field Plate", IEEE Electron Device Letters, V. 53, No. 10, Oct. 2006, pp. 2430-2437.

Kosaka, Fujishima, Inoue, Hinoki, Yamada, Tsuchiya, Kikawa, Kamiya, Suzuki, Araki, Nanishi, "Temperature distribution analysis of AlGaN/GaN HFETs operated around breakdown voltage using micro-Raman spectroscopy and device simulation", Physica Status Solidi (c), V. 4, No. 7, pp. 2744-2747, Jun 2007.

Simin, Koudymov, Tarakji, Hu, Yang, Khan, Shur, Gaska. "Induced strain mechanism of current collapse in AlGaN/GaN heterostructure field-effect transistors". Applied Physics Letters, V. 79, No. 16, pp. 2651-2653, 2001.

U.S. Appl. No. 13/537,407, filed Jun. 29, 2012, Kudymov.

Pytel, Lentijo, Koudymov, Rai, Fatima, Adivarahan, Chitnis, Yang, Hudgins, Santi, Monti, Simin, Khan, "AlGaN/GaN MOSHFET integrated circuit power converter". Proceedings of IEEE Power Electronics Spec. Conference (PESC'04), pp. 579-584, 2004.

Lee, Ha, Her, Lim, Seo, Han, "An AlGaN/GaN HEMT power switch employing a field plate and a floating gate", Physica Scripta, V. 126, pp. 65-67, Aug. 2006.

Simin, Tipirneni, Rai, Koudymov, Adivarahan, Yang, Khan, "1.5 kV Power AlGaN/GaN HFETs", 2005 International Semiconductor Device Research Symposium, ISDRS'2005 Abstract Book, pp. 164-165, Dec. 2005.

Simin, Hu, Ilinskaya, Kumar, Koudymov, Zhang, Khan, Gaska, Shur, "7.5kW/mm2 current switch using AlGaN/GaN metal-oxide-semiconductor heterostructure field effect transistors on SiC substrates". Electronics Letters, V. 36, No. 24, pp. 2043-2044, 2000.

Tipirneni, Koudymov, Adivarahan, Yang, Simin, Khan, "The 1.6 kV AlGaN/GaN HFETs", IEEE Electron Device Letters, V. 27, N9, 716-718, Sep. 2006.

Anwar, Islam, and Webster, "Carrier Trapping and Current Collapse Mechanism in GaN Metal-Semiconductor Field Effect Transistors", Applied Physics Letters, V. 84, No. 11, pp. 1970-1972, Mar. 2004.

Nozaki, Feick, Weber, Micovic, and Nguen, "Compression of the DC Drain Current by Electron Trapping in AlGaN/GaN Modulation Doped Field-Effect Transistors", Applied Physics Letters, V. 78, No. 19, pp. 2896-2898, May 2001.

Dora, Chakraborty, McCarthy, Keller, DenBaars, Mishra, "High Breakdown Voltage Achieved on AlGaN/GaN HEMTs With Integrated Slant Field Plates", IEEE Electron Device Letters, V. 27, No. 9, pp. 713-715, Sep. 2006.

Tipirneni, Adivarahan, Simin, Khan, "SiO2-Encapsulated High Voltage AlGaN/GaN HFETs for Power-Switching Applications", IEEE Electron Device Letters, V. 28, No. 9, pp. 784-786, Sep. 2007.

Saito, Nitta, Kakiuchi, Saito, Tsuda, Omura, Yamaguchi, "A 120-W Boost Converter Operation Using a High-Voltage GaN-HEMT", IEEE Electron Device Letters, V. 29, No. 1, pp. 8-10, Jan. 2008.

Karmalkar and Soudabi, "A Closed-Form Model of the Drain-Voltage Dependence of the OFF-State Channel Electric Field in a HEMT with a Field Plate", IEEE Transactions on Electron Devices, V. 53, No. 10, Oct. 2006.

Kosaka, Fujishima, Inoue, Hinoki, Yamada, Tsuchiya, Kikawa, Kamiya, Suzuki, Araki, Nanishi, "Temperature distribution analysis of AlGaN/GaN HFETs operated around breakdown voltage using micro-Raman spectroscopy and device simulation", Physica Status Solidi (c), V. 4, No. 7, pp. 2744-2747, Jun. 2007.

Gelmont, Shur, "Theory of Junction Between Two-Dimensional Electron Gas and p-Type Semiconductor", IEEE Transactions on Electron Devices, V. 39, No. 5, pp. 1216-1222, May 1992.

Simin, Koudymov, Tarakji, Hu, Yang, Khan, Shur, Gaska. "Induced strain mechanism of current collapse in AlGaN/GaN heterostructure field-effect transistors". Applied Physics Letters, Vo. 79, No. 16, pp. 2651-2653, 2001.

Koudymov and Shur, "Non-Ideal Current Transport in Heterostructure Field Effect Transistors", International Journal on High Speed Electronics and Systems, V. 18, No. 4, pp. 935-947, 2008.

Koudymov, Shur, Simin, Chu, Chao, Lee, Jimenez, Balistreri, "Analytical HFET I-V model in presence of current collapse", IEEE Transactions on Electron Devices, V. 55, N. 3, pp. 712-720, May 2008.

International Search Report and Written Opinion mailed Oct. 2, 2013 issued in connected with corresponding International Patent Application No. PCT/US2013/048067 (10 pages).

Nakajima, A. et al., "Novel field plate structure of AlGaN/gaN/ HEMTs", Physics State Solid C, vol. 4, No. 7, pp. 2736-2739 (2007). (4 pages).

Koudymov, Alexei, "Dynamic model of AlGaN/GaN HFET for high voltage switching," Solid-State Electronics, May 27, 2010, 6 pages.

Nakajima, Akira, et al., "GaN-Based Super Heterojunction Field Effect Transistors Using the Polarization Junction Concept," IEEE Electron Device Letters, Apr. 2011, 3 pages.

\* cited by examiner

FIELD EFFECT TRANSISTOR WITH ACCESS REGION RECHARGE

REFERENCE TO PRIOR APPLICATION

This application claims priority to U.S. Provisional Patent Application No. 61/242,869, filed Sep. 16, 2009.

FEDERALLY SPONSORED RESEARCH

Not Applicable

SEQUENCE LISTING OR PROGRAM

Not Applicable

FIELD OF THE DISCLOSURE

Aspects of the invention relate generally to high voltage switching using the field effect transistors, and in particular, to the field effect transistor with lateral channel design blocking the voltages over 100 V.

BACKGROUND OF THE DISCLOSURE

Field effect transistors with lateral channel design attract the power electronics design engineers as they offer much faster switching as compared to vertically built Si and SiC power field effect transistors (FETs). For example, Gallium Nitride based Heterostructure Field Effect Transistors (HFETs) demonstrate exceptional potential for power electronics applications as high voltage, high power switches. Since the first demonstration of high voltage operation [G. Simin, X. Hu, N. Ilinskaya et al, "7.5 kW/mm$^2$ current switch using AlGaN/GaN metal-oxide-semiconductor heterostructure field effect transistors on SiC substrates", Electronics Lett., V. 36, No. 24, pp. 2043-2044, 2000.], the breakdown voltages up to 1.5-2 kV have been reported, depending on the gate-drain spacing and surface conditions [N. Tipirneni, A. Koudymov, V. Adivarahan et al, "The 1.6 kV AlGaN/GaN HFETs", IEEE Electron Device Letters, V. 27, N9, 716-718, September 2006; S. G. Pytel, S. Lentijo, A. Koudymov et al, "AlGaN/GaN MOSHFET integrated circuit power converter", Proc. IEEE Power Electronics Specialists Conference (PESC'04), pp. 579-584, 2004]. While most of the reports mention the values of blocking voltages and ON resistances well above the performance of other semiconductor devices, very few demonstrations of the dynamic operation of such devices are published yet, mostly limiting the voltage range and switching frequency to low values. At sufficiently high frequencies exceeding 10-100 kHz, the dynamic breakdown voltage significantly degrades leading to the premature device blow up; and so called frequency dispersion, or current collapse [A. F. M. Anwar, S. Islam, and R. Webster, "Carrier Trapping and Current Collapse Mechanism in GaN Metal-Semiconductor Field Effect Transistors", Applied Phys. Lett., V. 84, No. 11, pp. 1970-1972, March 2004; S. Nozaki, H. Feick, E. R. Weber et al, "Compression of the DC Drain Current by Electron Trapping in AlGaN/GaN Modulation Doped Field-Effect Transistors", Applied Phys. Lett., V. 78, No. 19, pp. 2896-2898, May 2001], affects the ON resistance.

For the purpose of present invention, we will refer to the experimental results of one of the most complete experimental studies of the HFET breakdown voltages [G. Simin, N. Tipirneni, S. Rai et al, "1.5 kV Power AlGaN/GaN HFETs", 2005 International Semiconductor Device Research Simposium, ISDRS'2005 Abstract Book, pp. 164-165, December 2005]. In this study, the breakdown voltage dependences on the drain bias were compared for the HFETs with bare surfaces, silicon nitride passivation and utilizing the field plates. While in case of bare surface, the breakdown voltage was increasing nearly linearly with the gate-drain spacing LGD, reaching record high 1.6-1.8 kV with LGD=20 μm, after SiN passivation it decreased to spacing-independent 35-40 V, slightly recovering with the help of field plates.

Although the result for bare surface HFETs looks much more encouraging for power electronics, it does not find an explanation within traditional concept of the electric field distribution in the HFET channel (see, for example, [S. Karmalkar and N. Soudabi, "A Closed-Form Model of the Drain-Voltage Dependence of the OFF-State Channel Electric Field in a HEMT with a Field Plate", IEEE Trans. Electron Dev., V. 53, No. 10, October 2006; K. Kosaka, T. Fujishima, K. Inoue et al, Temperature distribution analysis of AlGaN/GaN HFETs operated around breakdown voltage using micro-Raman spectroscopy and device simulation, Physica Status Solidi (c), V. 4, No. 7, pp. 2744-2747, June 2007]). According to this concept, the electric field has a peak near the gate edge and decreases towards the drain with the slope that is nearly independent on the applied voltage, similarly to a p-n junction, in such a way that for long enough gate-drain spacing the peak value reaches the critical value for the breakdown, in accordance to the experimental data for SiN passivation. It was suggested in [G. Simin, N. Tipirneni, S. Rai et al, "1.5 kV Power AlGaN/GaN HFETs", 2005 International Semiconductor Device Research Simposium, ISDRS'2005 Abstract Book, pp. 164-165, December 2005] that in the case of bare surface, the electric field distribution along the channel is way different from this traditional concept. The two-gate measurement was performed in order to determine the actual channel voltage distribution, where the gate closest to the device source was used to control the channel, while the second gate was used as a probe electrode. The voltage sweep was applied to the second gate, and leakage current through it was detected. By zeroing the leakage current, the potential of the second gate was made equal to the channel potential beneath it. Studying the devices with different spacing between the first and the second gate, the authors of [G. Simin, N. Tipirneni, S. Rai et al, "1.5 kV Power AlGaN/GaN HFETs", 2005 International Semiconductor Device Research Simposium, ISDRS'2005 Abstract Book, pp. 164-165, December 2005] were able to reconstruct the channel potential distribution.

It was shown that the depletion region associated with high electric field domain in case of the bare surface HFET extends unexpectedly long at relatively low biases, reaching 2 μm for ~50 V and 6 μm for 75-100 V of drain bias. The authors suggested that such long depletion extension is somehow related to the charge at the HFET surface, however did not give detailed explanation.

The present invention provides an approach and method of designing the high voltage blocking FETs with lateral channel by providing an additional path for the access region recharge during the FET switching. It will be demonstrated that the access region recharge is a necessary component in achieving fast and reliable switching and voltage blocking.

SUMMARY OF THE INVENTION

Aspects of the invention are directed to the field effect transistors with lateral channel designed to block high voltages and comprising active, gated region for channel current control and access region for electric field spread during high voltage application.

An objective of present invention is to provide a method for estimating the current density and conductivity necessary for the said active region recharge during the FET switching from ON state to OFF state and from OFF state to ON state for given blocking voltage and switching front time, and thus provide the enabling design for the power FET with desired performance in aspects of—including, but not limited to—high voltage blocking capabilities, stability against premature breakdown, switching speed, dynamic ON resistance, and control circuit design.

According to the present invention the said performance enhancements can be achieved by providing an additional electrical current path that delivers the charge back and forth to the ungated access region of a FET located between the gated channel and the drain electrode. By doing so, the access region remains flooded with free current carriers to provide low resistivity when the FET is driven to ON state, while screening the fixed charge in the semiconductor body, including the FET channel, buffer and barrier layers and device surface(s) when the said FET is driven to OFF state.

It is understood that for the purpose of the present invention, the FET is considered to be connected into the voltage blocking circuit in "common source" configuration, so that the high voltage is applied to the FET drain in the OFF state, the current is passing through the FET channel between the drain and the source in the OFF state, and the FET gate is used to control the FET channel conductivity for the purposes of switching back and forth between the ON state and the OFF state.

In a first aspect of the present invention, a method of determining the upper limit of the net total charge density in the access region for a given desired breakdown voltage is provided.

In a second aspect of the present invention, a method of determining the current density recharging the access region for a given switching time is provided.

In a third aspect of the present invention, a method of determining the maximum resistivity of the recharging current path is provided.

In a fourth aspect of the present invention, the FET design satisfying the said conditions for the breakdown voltage, recharging current density and recharging current path resistivity is provided.

BRIEF DESCRIPTION OF THE DRAWINGS

These and other features of the present invention will be more readily understood from the following brief description of the various aspects of the invention taken in conjunction with the accompanying drawings.

It is noted that the drawings of the invention are not to scale. The drawings are intended to depict only typical aspects of the invention, and therefore should not be considered as limiting the scope of the invention.

DETAILED DESCRIPTION OF INVENTION

Figure 1:
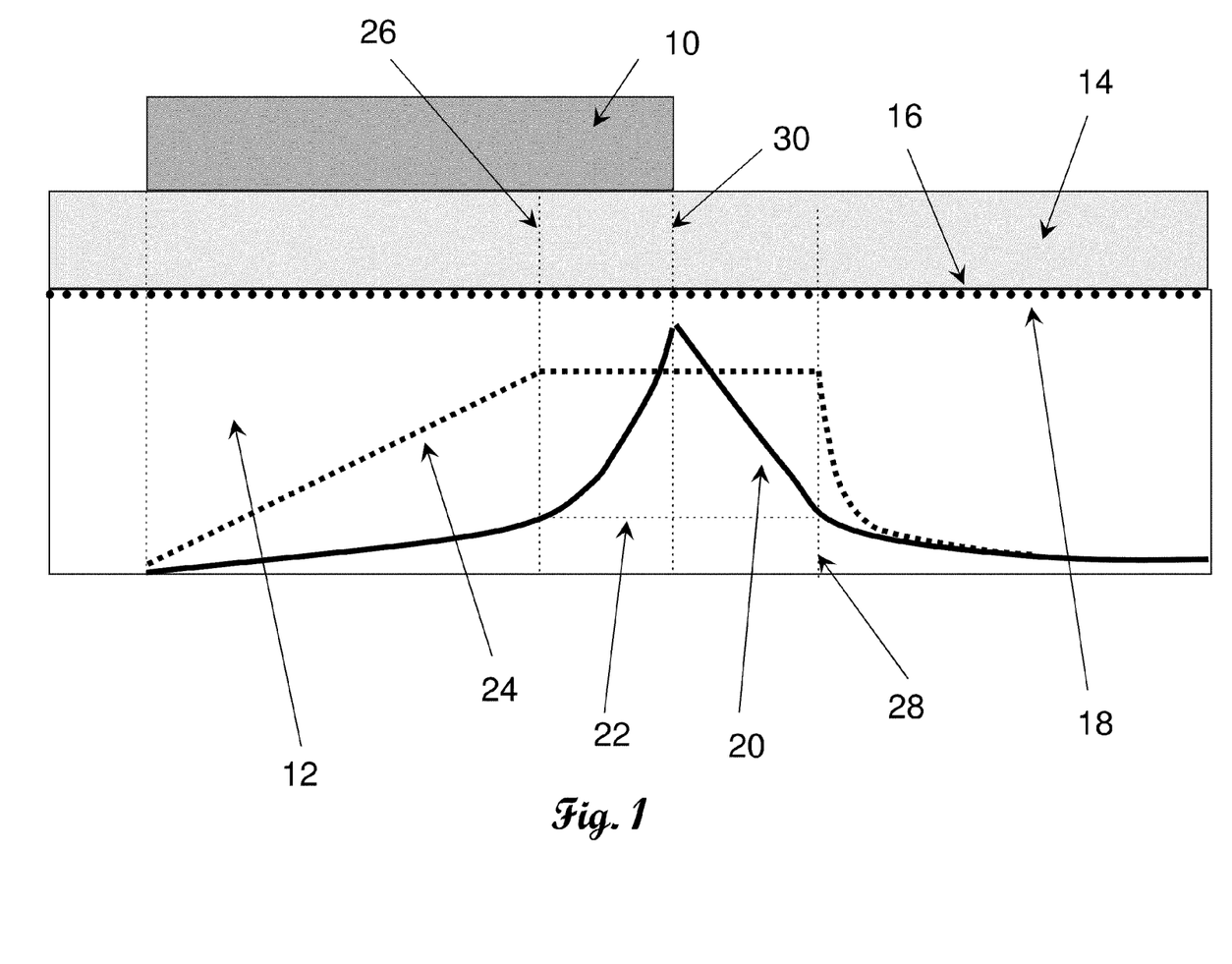
FIG. 1 schematically depicts the gated area and nearby areas of the FET, electric field and electron velocity distribution along the electrical current channel, and depletion regions.

FIG. 1 provides a schematic view of the gate 10 and surrounding active area of the FET with laterally defined narrow, so-called two-dimentional (2D) channel 18 located at the heterointerface 16 between the buffer layer 12 and barrier layer 14 comprising semiconductor materials and/or compounds with different band gap, for example GaAs, InGaAs, AlGaAs, AlInGaAs, GaN, InGaN, AlGaN, AlInGaN or similar. Under the bias applied to the FET drain, the electric field and current carrier velocity distribute over the said active area non-uniformly, with lateral electric field distribution 20 having a peak at the drain edge of the gate 30, and carrier velocity distribution 24 having a plateau with the value corresponding to saturation velocity, within the region between the cross-section 26 under the gate 10 where the electric field reaches velocity saturation value 22, and the cross-section 28 outside the gated area, within the gate-drain spacing, where the electric field decays to the said velocity saturation value 22. For the purpose of the present invention, the region between the gate edge cross-section of the channel 30 and the said cross-section 28 outside the gated area is called the depletion region extension, and the distance between the two said cross-sections is the depletion region extension length, or depletion region length.

The electric field distribution 20 in the FET channel operating at high drain bias was studied both analytically [B. Gelmont, M. Shur, "Theory of Junction Between Two-Dimensional Electron Gas and p-Type Semiconductor", IEEE Trans. Electron Dev., V. 39, No. 5, pp. 1216-1222, May 1992] and using 2D numerical simulations [S. Karmalkar and N. Soudabi, "A Closed-Form Model of the Drain-Voltage Dependence of the OFF-State Channel Electric Field in a HEMT with a Field Plate", IEEE Trans. Electron Dev., V. 53, No. 10, October 2006]. The expression for the voltage dependence of the total charge in the depletion region extension derived in [B. Gelmont, M. Shur, "Theory of Junction Between Two-Dimensional Electron Gas and p-Type Semiconductor", IEEE Trans. Electron Dev., V. 39, No. 5, pp. 1216-1222, May 1992] for the heterostructure diode can be directly applied to the HFET channel, replacing the 2-dimentional charge density with the net total of channel and surface charge:

$$Q_{GD} \approx 2 \cdot W((\epsilon_S+1)/2) \cdot \epsilon_0 V''_D = W \cdot q \cdot d_{DEP} \cdot (n_{TOT} - n_J - n_S) \quad (1)$$

where $Q_{GD}$ is the total charge stored in the depletion region extension between gate and drain, with the length $d_{DEP}$ and charge density $q(n_{TOT}-n_J-n_S)$, $qn_{TOT}$ being the sum of AlGaN/GaN heterointerface piezoelectric charge and ionized donor charge density per unit area, $qn_S$–total surface charge, and $qn_J$ the electron charge in the channel, $qn_J=J/v_S$, $v_S$ the saturation velocity and $J$ the channel current density per unit width; $\in_S$ the dielectric constant of the semiconductor material (~8.9 for GaN), $\in_0$ the permittivity of vacuum, $V''_D$ the voltage drop along the channel between the drain edge of the gate and the drain as depicted in FIG. 1, W is the device width. In Equation (1), the term $(\in_S+1)/2$ stands for half of the space filled with the semiconductor, and the other half with vacuum (air). If a passivation layer is used with dielectric constant $\in_P$, the term should be replaced with $(\in_S+\in_P)/2$.

Figure 2:
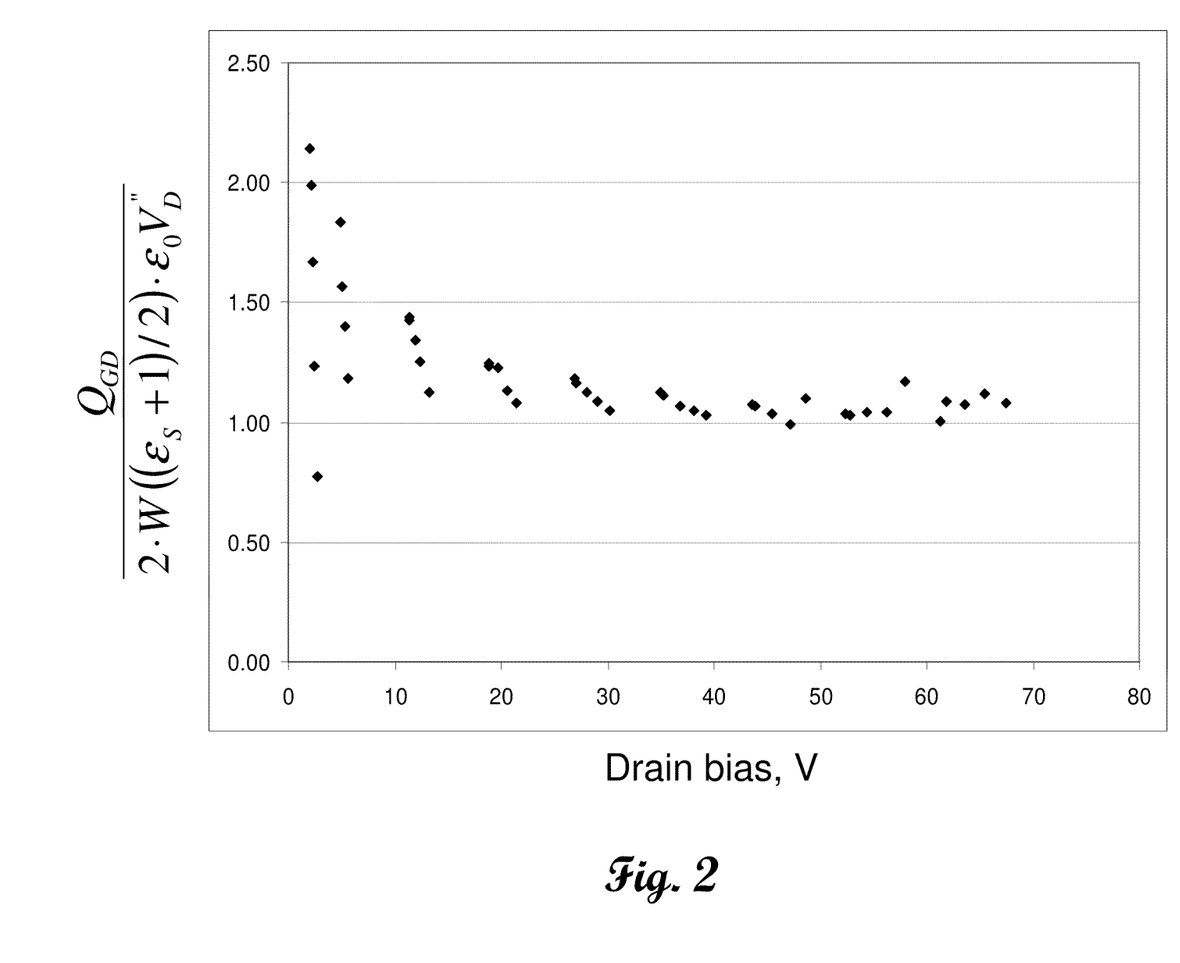
FIG. 2 validates the gate-drain spacing charge dependence on the voltage drop along the channel, according to the 2D simulations by TCAD.

The validity of Equation (1) is illustrated in FIG. 2. FIG. 2 presents the dependence of the total charge stored in the depletion extension as a function of the drain bias for different channel current levels controlled by the gate potential obtained using the 2D simulation by the TOAD software. The simulations were performed for the FET comprising GaN buffer layer 12 and AlGaN barrier layer 14 with Al fraction of 0.25. Parameters used for simulation: electron mobility $\mu=0.1$ m²/V–s, saturation velocity $v_S=1.2\cdot10^5$ m/s, gate length $L=0.3$ μm, barrier thickness $d=175$ Å, threshold voltage of the FET $V_T=-3.75$ V, sheet carrier density in the channel at zero gate bias $n_{S0}=1.2\cdot10^{17}$ m$^{-2}$, AlGaN barrier dielectric constant $\in=8.9$. For the drain biases above the knee voltage of ~5 V, the Equation (1) is held with good accuracy, which even improves as the drain bias goes higher.

Analytical approach of [B. Gelmont, M. Shur, "Theory of Junction Between Two-Dimensional Electron Gas and p-Type Semiconductor", IEEE Trans. Electron Dev., V. 39, No. 5, pp. 1216-1222, May 1992] does not allow for peak electric field estimation due to log-type singularity near the gate edge. Karmalkar at al. [S. Karmalkar and N. Soudabi, "A Closed-Form Model of the Drain-Voltage Dependence of the OFF-State Channel Electric Field in a HEMT with a Field Plate", IEEE Trans. Electron Dev., V. 53, No. 10, October 2006] suggest the following approximation for the peak field $F_g$:

$$F_g = \gamma \cdot \sqrt{n_{TOT} V_D} \quad (2)$$

We slightly modify this expression to account for the surface states, electric current and voltage redistribution between gated and ungated portions of the FET:

$$F_g = \gamma \cdot \sqrt{(n_{TOT}-n_J-n_S) \cdot V''_D} \quad (2a)$$

Substituting the parameters into Karmalkar's expression for γ, we obtain, for example, for AlGaN/GaN HFET with the AlGaN barrier thickness of 20 nm the values in the range of 0.244-0.6 V$^{1/2}$, which is very close to the value of 0.255 V$^{1/2}$ we obtained using validating 2D simulations by Centaurus TOAD.

Figure 3:
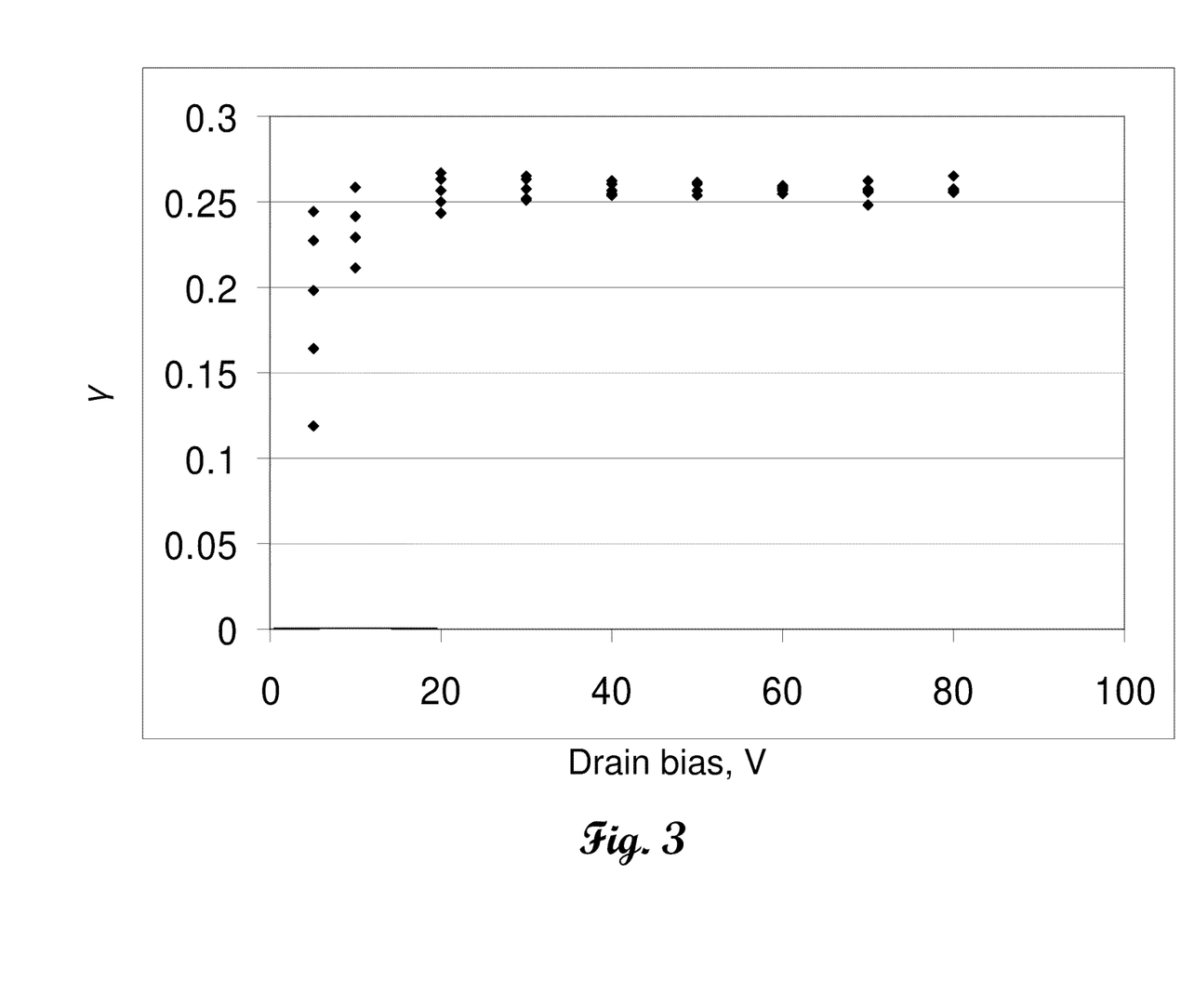
FIG. 3 validates the peak electric field dependence on the voltage drop along the channel, according to the 2D simulations by TCAD.

The validating simulations are summarized in FIG. 3 that presents the dependence of parameter γ extracted at different drain biases and controlling gate voltages. The simulations were performed for the FET comprising GaN buffer layer 12 and AlGaN barrier layer 14 with Al fraction of 0.25. Parameters used for simulation: electron mobility $\mu=0.1$ m²/V–s, saturation velocity $v_S=1.2\cdot10^5$ m/s, gate length $L=0.3$ μm, barrier thickness $d=175$ Å, threshold voltage of the FET $V_T=-3.75$ V, sheet carrier density in the channel at zero gate bias $n_{S0}=1.2\cdot10^{17}$ m$^{-2}$, AlGaN barrier dielectric constant $\in=8.9$. Similar to the results presented in FIG. 2, the accuracy of Equation (2a) improves as the drain bias increases.

It can be clearly seen that expression (2) predicts the field reaching critical value for GaN of ~3 MV/cm at drain biases as low as 25 V. Therefore, in order to satisfy the experimental breakdown of up to 2 kV, one has to suggest that the surface charge density $n_S$ in case of bare surface nearly compensates the donor density in the channel $n_{TOT}$. Using high values of $n_S$, it is also possible to obtain from Equation (1) the depletion extension $d_{DEP}$ values close to the experimental ones. However, if the voltage increases to several hundreds of volts, the depletion region rapidly extends all the way towards the device drain.

In the past, many researchers associated the high field region reaching the drain with the punch-through breakdown condition. We, however, believe that in real devices, the depletion reaches the drain without any dramatic consequences, since the current is still controlled by the gate, and no significant holes current contribution was ever achieved in GaN HFETs. Although due to specific properties of an annealed contact, the breakdown field near the drain can be sufficiently lower than for "bulk" GaN, it can be still much higher than velocity saturation field F.

Figure 4:
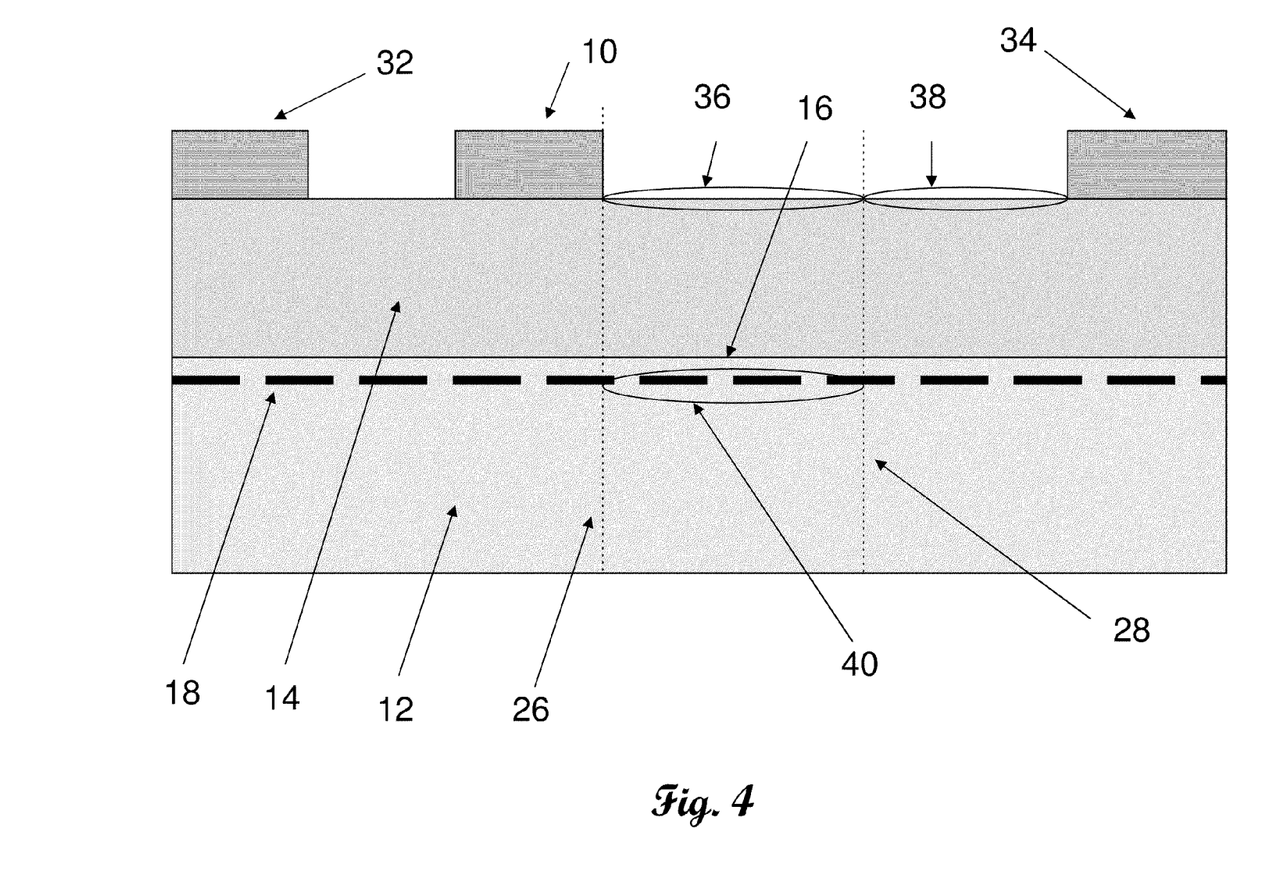
FIG. 4 schematically locates fixed and variable charges in the FET channel and at its surface.

The model to explain the formation of long high field region domain in GaN HFETs is illustrated by FIG. 4. Under high drain bias, the electron concentration in the FET channel 18 within the depletion extension region, 40, is given by $n_J$. While the surface charge outside the depletion region 38 remains practically the same as for the unbiased device, with zero voltage applied between the FET source electrode 32 and FET drain electrode 34, the surface charge over the depletion region 36 is modified, thus compensating the space charge due to depletion. We speculate that under zero bias, in the ungated portions of the FET the piezoelectric charge of the top surface $\sigma_P$ is completely compensated by mobile charge precipitated from ambient, so that total surface charge is zeroed. Let's first consider the gate in the OFF state, so that the current through the channel is zero, and the drain bias increasing slow enough to allow the surface charge 36 reach equilibrium condition with respect to the channel charge beneath it. In this case, as the gate bias increases and depletion extends towards the drain, the mobile surface charge over the newly depleted area is repelled back to the ambient by the uncompensated donor charge of the same area. As a result, the depletion region further extends in accordance to the new net total space charge, while the current is flowing from surface to ambient of mobile surface charge, and from the depletion region edge to the drain—of the free electrons of the portion of the channel that becomes depleted. Some small amount of mobile surface charge $\sigma_{SDEP} \ll \sigma_P$ may still remain on the depletion region top surface, due to the potential barrier at the surface. We will show that this remaining charge plays crucial role during the OFF to ON transient of a FET.

Figure 5:
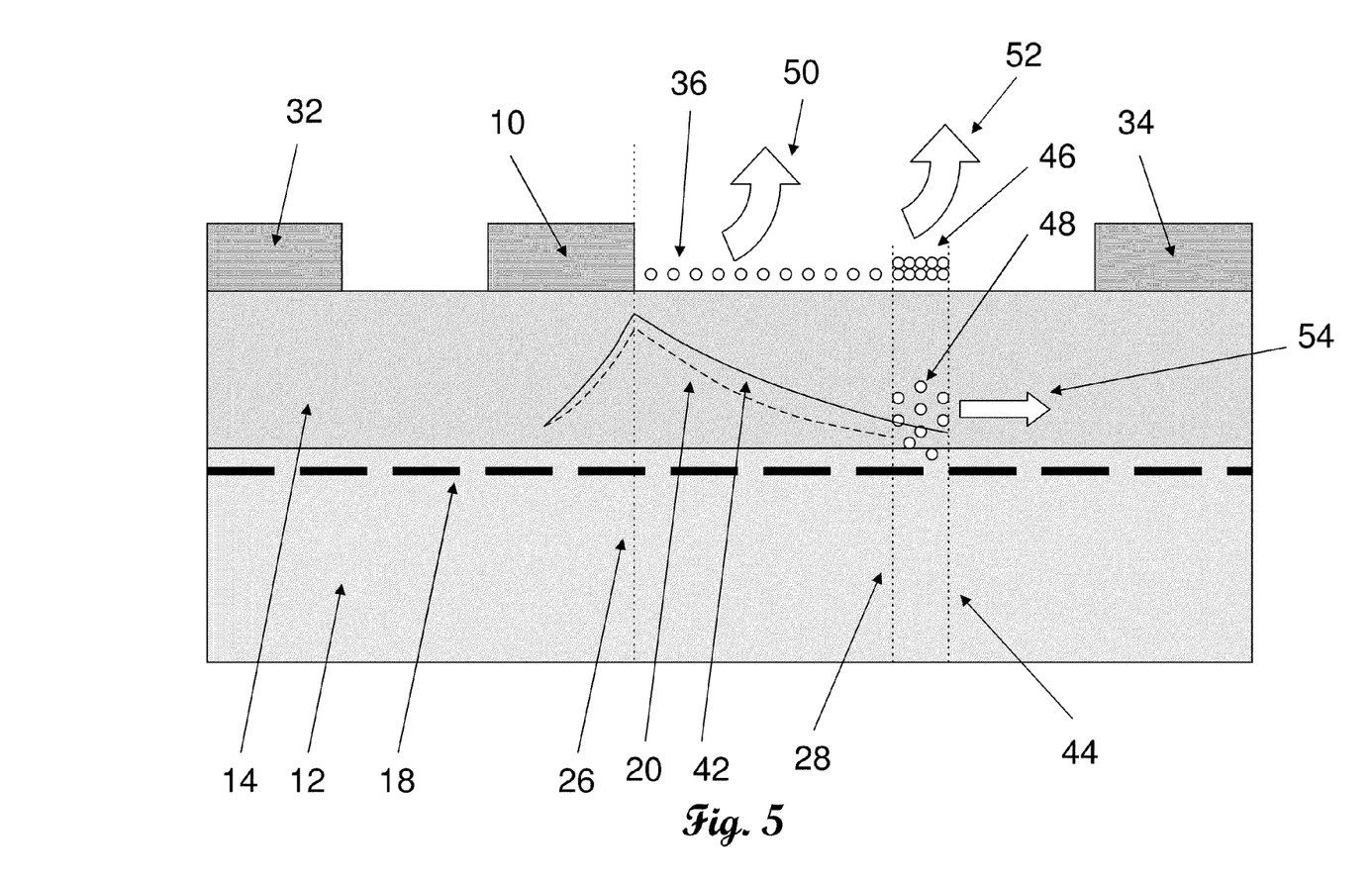
FIG. 5 illustrates the charge dynamics in the FET channel and at its surface due to the change in applied drain and gate biases.

The dynamics of the depletion region extension coupled with the surface charge dynamics is schematically shown in FIG. 5. As the voltage applied to the FET drain 34 is increased by the amount ΔV, the electric field distribution 20 is modified, and the new electric field distribution 42 leads to the depletion region edge 28 shift to a new position 44 towards the FET drain 34. At the same time, due to the coupled change in the channel current according to the switch load line, the surface charge density over the depletion region 36 is changed. The new equilibrium is obtained with the help of drain current 54 that removes the excessive electrons 48 from the portion of the channel newly involved in the depletion, the surface discharge current from the older depletion region 50, and the surface discharge current over the said portion of the channel newly involved in the depletion 52 carrying out the excessive surface charge 46.

According to our assumption of slowly increasing bias, the net total charge density in the depleted portion of the channel is given by $q \cdot n_{TOT} - \sigma_P + \sigma_{SDEP} \approx \sigma_{SDEP}$. Thus, the depletion length is:

$$d_{DEP} = \frac{(\varepsilon_S + 1)\varepsilon_0}{\sigma_{SDEP}} V_D''. \quad (3)$$

Figure 6:
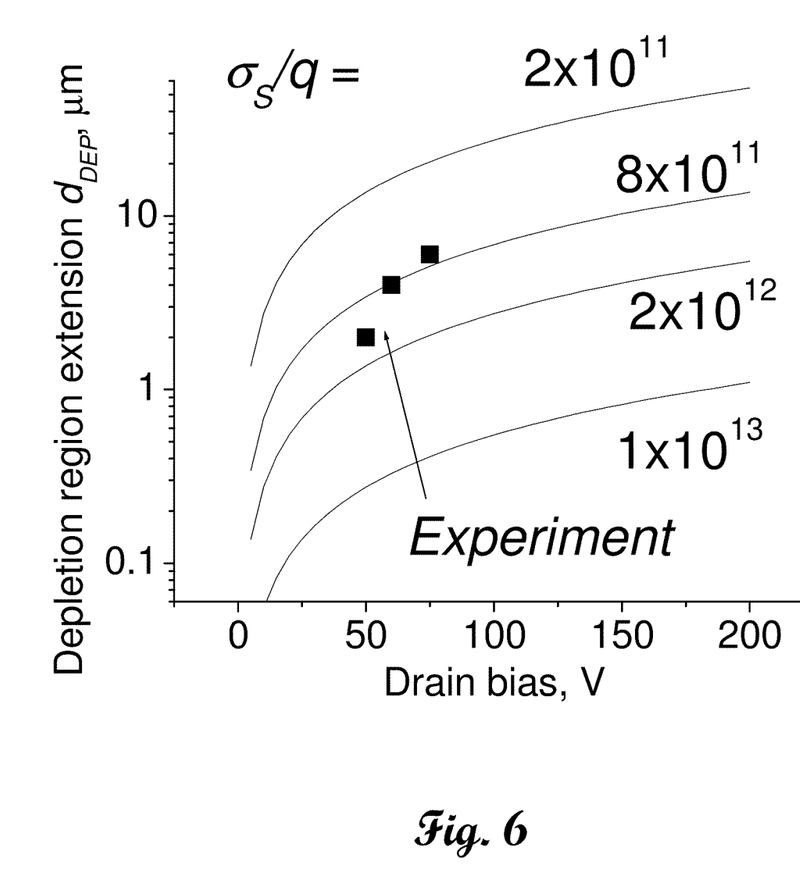
FIG. 6 gives calculated and experimental dependence of the depletion region length on the applied drain bias of the FET.

The depletion length as a function of applied voltage according to the Equation (3) is plotted in FIG. 6, assuming $V_D'' \approx V_D$. A good fit to the experimental data is obtained at $\sigma_S/q \sim 8 \times 10^{11}$ cm$^{-2}$, much lower than $n_{TOT}$.

Once the depletion region reaches the drain contact, the charge in the channel and at the surface of the FET does not change any more, since there are no mobile charges left (there could be some piezoelectric charges generated by induced strain [G. Simin, A. Koudymov et al. "Induced strain mechanism of current collapse in AlGaN/GaN heterostructure field-effect transistors". Appl. Phys. Lett. V. 79, No. 16, pp. 2651-2653, 2001], but we will ignore them for simplicity). Therefore, we assume that the space derivative of the electric field in the gate-drain spacing does not change, but rather increases uniformly as the drain bias further increases, accompanied by additional charge generation between gate and drain electrodes, according the gate-drain geometric capacitance. So, if at some drain voltage $V_{DD}$ the depletion region touches the drain, and peak channel electric field at the gate edge at this voltage is $F_{DD}$, for any higher drain bias $V_D$ we can approximately write for the gate edge field:

$$F_g(V_D > V_{DD}) = F_{DD} + F_D = F_{DD} + (V_D'' - V_{DD}'')/L_{GD}, \quad (4)$$

where $F_D$ is the channel electric field and the drain, and $L_{GD}$ is the gate-drain spacing. Thus, combining Eqs. (2a), (3) and (4), we derive for the gate edge field:

$$F_g = \begin{cases} \gamma \cdot \sqrt{\sigma_{SDEP} \cdot V_D''/q}, & V_D'' \leq \frac{\sigma_{SDEP} L_{GD}}{\varepsilon} \\ \gamma \cdot \sigma_{SDEP} \cdot \sqrt{\frac{L_{GD}}{q\varepsilon}} + \frac{V_D''}{L_{GD}} - \frac{\sigma_{SDEP}}{\varepsilon}, & V_D'' > \frac{\sigma_{SDEP} L_{GD}}{\varepsilon}, \end{cases} \quad (5)$$

where $\varepsilon = (\varepsilon_S + 1)\varepsilon_0$.

Figure 7:
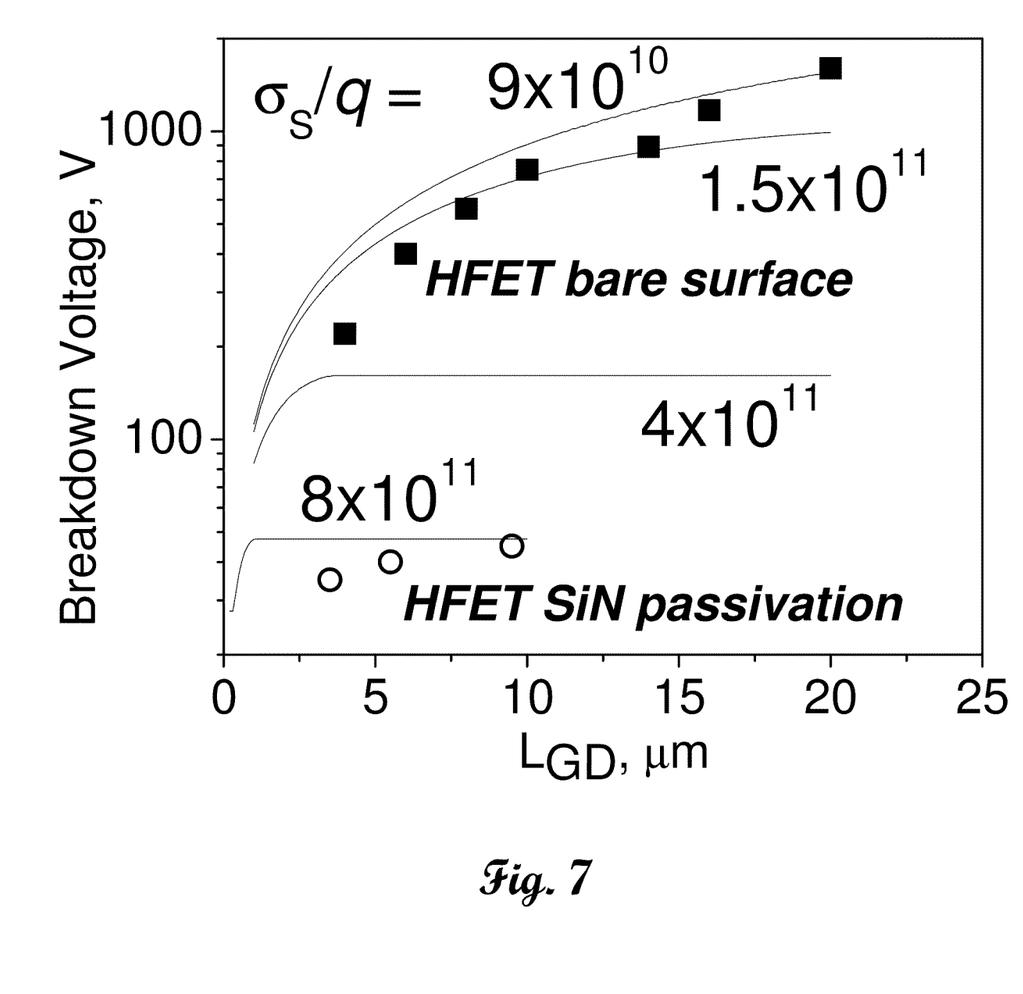
FIG. 7 provides calculated and experimental dependences of the breakdown voltage on the gate to drain spacing of the FET.

At high drain biases, where the depletion region extension is much longer than the device gate, and neglecting the contact and source access resistances, we can also neglect the voltage drop across the gated area of the FET: $V_D'' \approx V_D$. With such a substitution, Equation (5) clearly explains the linearity of the breakdown voltage with gate-drain spacing. The dependence of the breakdown voltage on $L_{GD}$ for different values of $\sigma_{SDEP}$ is shown in FIG. 7. The good fit to the experimental data is obtained at $\sigma_{SDEP} = 9 \times 10^{10}$ cm$^{-2}$, which is ~1% of the 2D gas density in the channel for typical AlGaN/GaN HFET.

Comparing the results of FIGS. 6 and 7, we may conclude that in real FET, the surface charge density depends on the applied bias. It is reasonable to suggest that it is also not uniform within the gate-drain spacing, so that in the immediate vicinity of the gate the surface charges extra negatively, leading to the formation of so-called "virtual gate", which was used in the past as one of the models to explain the current collapse phenomena. As it was shown in [A. Koudymov and M. Shur, "Non-Ideal Current Transport in Heterostructure Field Effect Transistors", Int. Journal on High Speed Electronics and Systems, V. 18, No. 4, pp. 935-947, 2008], this charge leads to often observed positive offset of the device I-V characteristic measured immediately after the high bias removal. This bias dependence also constitutes some bad news for the researchers who are trying to model the HFET behavior at high voltages by biasing them to 50-100V. Obviously, since FIGS. 6 and 7 suggest very different surface conditions for 50-100 V as compared to 1-1.5 kV, it is hard to expect that any experiment in the first bias range can give useful information regarding the last bias range.

We will now, for exemplary purposes, consider the FET operating as a power switch under the resistive load, with the load $R = (V_B - V_{KNEE})/I_{ON}$, where $V_B$ is the switched voltage, $V_{KNEE}$ the knee voltage of the FET, and $I_{ON}$ the channel current in the ON state. As the gate bias goes more negative, the drain voltage of the FET increases, and the depletion region extends from the gate edge towards the gate, as in previous example. We assume that the surface charge over the portion of the channel that is not yet depleted remains at its equilibrium value.

By the analogy with previous example, the surface charge over the depletion region modifies in such a way that in the steady state, it would reach another equilibrium point, set up by the equation $$q \cdot n_{TOT} - \frac{I}{W \cdot v_S} - \sigma_P + \sigma_S \approx \sigma_{SDEP}, \quad (6)$$

where $$\frac{I}{W \cdot v_S}$$

is the electron charge in the channel, and $\sigma_S$ is the steady-state surface charge corresponding to some intermediate point of the load line. In real time, however, equation (6) is impossible to hold: it would lead to instant change of the surface charge over the part of the depletion region newly involved into the depletion 46, from $\sigma_P$ to $\sigma_S$, which in turn would require infinite current density 52 from surface to ambient over this region.

The exact solution for the surface charge density distribution and dynamics is an extremely complicated task that must be solved self-consistently with the electric field distribution problem. We suggest as an approximate solution to assume uniform surface charge distribution within (dynamically changing) depletion region. At any instant before the depletion region reached the drain, the peak electric field at the gate edge must be lower than the breakdown field:

$$F_G = \gamma \cdot \sqrt{\sigma_S \cdot V_D/q} < F_{BR} \quad (7)$$

This condition is satisfied if $$\sigma_S(t) < \frac{q F_{BR}^2}{\gamma^2 V_D}, \quad (8)$$

which is held, for example, if $$\frac{d}{dt}\sigma_S(t) = j_S < -\frac{q F_{BR}^2}{\gamma^2 V_D^2} \frac{dV_D}{dt}, \text{ or } |j_S| > \frac{q F_{BR}^2}{\gamma^2 V_D^2} \frac{dV_D}{dt}, \quad (9)$$

where $j_S$ is the current density, per unit area, from surface to ambient.

Let us assume the gate voltage to change from 0 to the threshold voltage value $V_T<0$ during time T. In this case, the change of the gate voltage by $\Delta V_G = \Delta t \cdot V_T/T$ leads to change in the drain current by $gm \cdot \Delta V_G$, where gm is transconductance, and change in drain voltage of $-R \cdot gm \cdot \Delta V_G$. Equation (9) can be then rewritten as $$|j_S| > \frac{qF_{BR}^2}{\gamma^2 V_D^2} R \cdot gm \cdot \frac{V_T}{T}. \quad (10)$$

Figure 8:
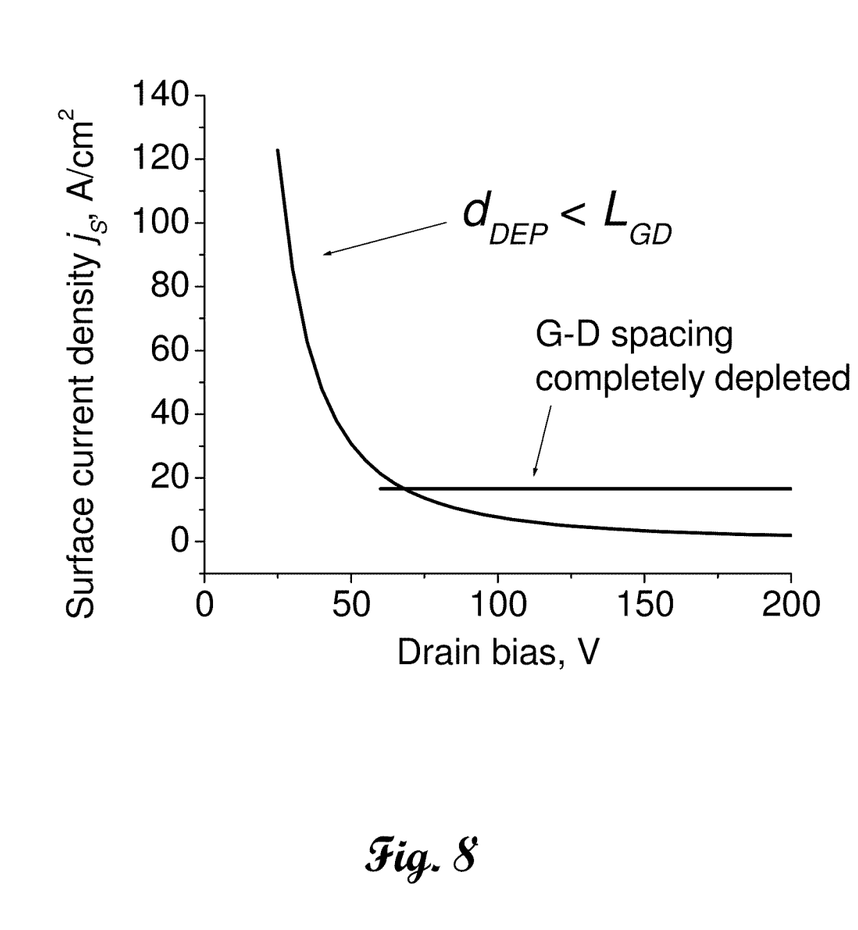
FIG. 8 illustrates an example calculation of the surface discharge current necessary for safe operation of high voltage FET.

This condition, of course, only makes sense when $V_D$ ranges between $V_{BR0}$ and $V_{DD}$, where $V_{BR0}$ is the breakdown voltage without surface recharge. FIG. 8 illustrates the example calculated surface discharge current density as a function of the instant drain bias. It follows from FIG. 8 that the highest discharge currents are needed at the drain voltages below 50 to 75 V, where the length of the depletion region, according to the experimental data from [N. Tipirneni, A. Koudymov et al, "The 1.6 kV AlGaN/GaN HFETs", IEEE Electron Device Letters, V. 27, N9, 716-718, September 2006], ranges somewhere from 2 to 6 μm. Reasonable device design would, therefore, address the surface discharge issue within the said distance immediately near the gate edge.

At the same time, the net total channel plus surface charge in the ungated portion of the FET, according to Equation (1), is always equal to $W \cdot \in \cdot V_D$. Charge variation can be expressed as $$\Delta Q_{GD} = W \cdot \in \cdot \Delta V_D = W \cdot \in \cdot R \cdot gm \cdot \Delta V_G. \quad (11)$$

Thus, the corresponding gate to channel capacitance (in addition to the direct gate-source capacitance of the gated region of the FET) is $$C_{ADD} \approx W \cdot \varepsilon \cdot R \cdot gm = W \cdot \varepsilon \cdot gm \cdot \frac{V_B}{I_{ON}} \approx W \cdot \varepsilon \cdot \frac{V_B}{V_T}. \quad (12)$$

This capacitance should be used in calculating the gate current before the depletion region touches the drain. We have to mention, however, that although the ratio $V_B/V_T$ can be set as high as $10^3$, the displacement current caused by this additional capacitance may be still much lower than the total surface recharge current $W \cdot d_{DEP} \cdot j_S$.

After the depletion region hits the drain contact, it stops expanding, but instead the electric field in the gate-drain spacing becomes more uniform. This process is possible only if the surface discharge current continues to flow. The lower limit of this current density corresponds to the situation when Equation (6) is nearly satisfied; in this case, the surface charge concentration needs to follow the electron density in the channel due to variation of the drain current:

$$\Delta Q_{surface} = -\Delta Q_{channel} = -\frac{L_{GD}}{v_S} \cdot \Delta I = \frac{gm \cdot L_{GD}}{v_S} \cdot \frac{V_T}{T} \Delta t \quad (13)$$

The corresponding surface current density is $$j_S = \frac{gm}{W v_S} \cdot \frac{V_T}{T} \quad (14)$$

For a very typical switching front width of 50 ns, Equation (14) gives the surface current density of ~17 A/cm², as shown by a horizontal bar in FIG. 8.

As it was mentioned before, the additional gate to channel capacitance in this case is only equal to the geometric capacitance between gate and drain electrodes. If, however, the surface continues to release extra charge, the corresponding capacitance is higher, providing a smooth transition between Equation (12) and fringing capacitance discussed earlier in this paragraph.

Similar expressions can be obtained using the same approach for the power switching field effect transistor operating under other types of the loads, for example, in practically very important for power electronics applications case of inductive load. Overall, in the case the load used is not purely resistive, the above mentioned device capacitances must be taken into the account while calculating the dynamic current-voltage states of the field effect transistor switch.

Let us now discuss the situation when the applied signal is much faster than the surface discharge rate. In this case, we can neglect the surface current and write for the depletion extension and peak field:

$$d_{DEP} = \frac{(\varepsilon_S + 1)\varepsilon_0}{qn_{TOT} - \frac{I}{W v_S}} V_D, \quad (15)$$

$$F_g = \gamma \cdot \sqrt{\left(qn_{TOT} - \frac{I}{W v_S}\right) \cdot V_D} \quad (16)$$

Using the approach of previous section and load line equation $I = I_{ON}(1 - V_D/V_B)$, we obtain the expression for the gate to channel capacitance identical to Equation (12). In this case, however, the depletion region extends much slower towards the drain, and for any practical gate-drain spacing the edge field reaches the breakdown value before the depletion reaches drain.

As a result, the FET driven faster than the surface discharge time experiences premature breakdown, which in most cases leads to irreversible device degradation. The surface discharge time becomes, therefore, the most important parameter limiting the FET switching speed. On the other hand, as we discussed before, the charge associated with the additional capacitance must travel through the device drain terminal, so that the capacitance of Equation (12) forms an RC line with the load resistance. This RC line sets the fastest operating speed of a switch. Assuming typical FET parameters of gm=2.5 S/cm and $I_{ON}$=10 A/cm, we obtain an RC time $\tau \sim 2 \times 10^{-14}(V_B)^2$ s.

For example, the switch designed to block 1.5 kV will, according to this estimate, has the RC delay time of 45 ns.

Driving the FET from OFF state to ON differs quite a lot from the process discussed above. If in previous case, high charge density was generated in the device channel pushing the surface to discharge, during the opposite process the channel charge cannot be changed a lot, since the discharged surface blocks the channel from passing the current. Below, we will discuss this process dynamics, based on the "static" model of the FET with trapped charge in the gate-drain spacing developed in [A. Koudymov and M. Shur, "Non-Ideal Current Transport in Heterostructure Field Effect Transistors", Int. Journal on High Speed Electronics and Systems, V. 18, No. 4, pp. 935-947, 2008; A. Koudymov, M. S. Shur, G. Simin, K. Chu, P. C. Chao, C. Lee, J. Jimenez, and A. Balistreri, "Analytical HFET I-V model in presence of current collapse", IEEE Trans. Electron Dev., V. 55, N. 3, pp. 712-720, May 2008"].

According to the referenced model, the current through the carrier-deficient region is limited to $Wq(n_{TOT}-n_{TRAP})v_S$, where $n_{TRAP}$ is the density of the trapped charge, unless very high drain bias punching through the carrier deficient region is applied. The later situation is in principle possible in case of a high voltage switch; however, the resulting increase in the drain current is very small and will not significantly affect the result.

We will assume for the purpose of this discussion that by reaching the initial OFF state with high blocking voltage $V_B$, in the range from several hundreds volts to several kilovolts, the surface charge in the entire gate-drain spacing was modified from its equilibrium value, $\sigma_S=0$, to $-qt_{TOT}+\sigma_{SDEP}$, so that the net total channel plus surface charge density is $\sigma_{SDEP}$. During the OFF to ON transient, the surface of the entire gate-drain spacing has to recharge back to zero, recovering the equilibrium electron concentration in the ungated region.

Assuming the switching front duration T, the corresponding surface current density is given by $$j_{SON} = \frac{qn_{TOT} - \sigma_{SDEP}}{T} \approx \frac{qn_{TOT}}{T} \quad (17)$$

The net total charge density of $\sigma_{SDEP}$ creates at the FET surface the electric field normal to the surface, of $F_N=\sigma_{SDEP}/\epsilon_0$ (or $F_N=\sigma_{SDEP}/(\epsilon_t\epsilon_0)$, if the encapsulating material with dielectric permittivity $\epsilon_t$ is used). This field is shielded by the surface potential well slope. As the gate of the device opens up, and the current starts flowing through the channel with the electron density $qn_f=\sigma_{SDEP}$, this field becomes uncompensated and works as a driving force for the surface recharge. Given the field and the current density of Equation (16), we can now estimate the resistivity of an ambient (or encapsulating material) to support the surface recharge. It is given by $$\rho_S = \frac{T}{\varepsilon_t\varepsilon_0} \frac{\sigma_{SDEP}}{qn_{TOT}} \quad (18)$$

Figure 9:
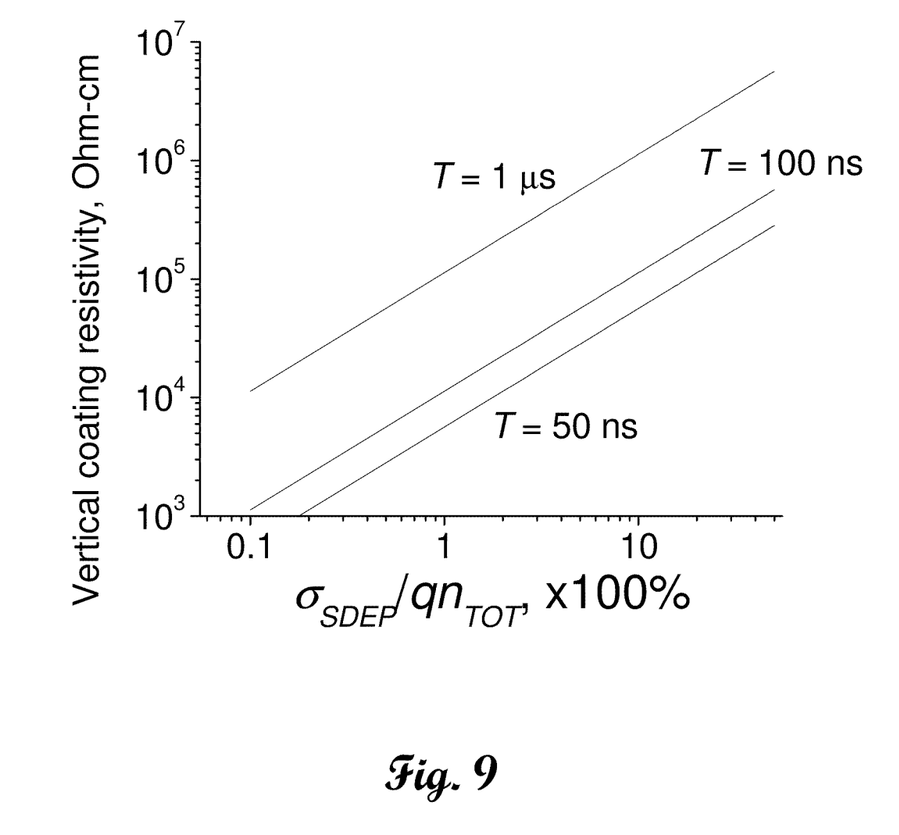
FIG. 9 illustrates an example calculation of the surface coating resistivity in vertical direction necessary for rapid device transition into open state.

The resistivity is plotted in FIG. 9 for some practical set of device parameters. It is important to note that this resistivity should be, for the conventional device design, highly anisotropic: shunting of a surface in lateral direction (along the surface) may lead to the surface breakdown or non-uniform surface charge distribution and high local fields in the channel, again leading to the breakdown.

It must be noted that currently, many research groups are trying to extend the FET breakdown voltage by developing a system of the field plates modifying the electric field in the channel. Such an approach can be interpreted as an introduction of one or more rechargeable stripes (field plate edges) over the device surface. The amount of the charge is controlled by field plate connection (usually gate or source) and the dielectric thickness beneath each field plate. This is of course an indirect way to satisfy the surface design requirements discussed above. Obviously, by increasing the number of the field plates, the fabrication process that requires precise alignment and dielectric thickness control becomes more and more complicated. It seems to be much more practical to control the surface discharge directly, by developing coating materials and structures with the properties listed below.

DESCRIPTION OF THE PREFERRED EMBODIMENT

As it was mentioned above, the AlGaN/GaN HFET is exceptionally promising for power electronics applications. It demonstrates both ON and OFF states that greatly outperform devices from other material systems. However, the transition between these states is not obvious. It requires change of the state of an important element of the device: gate-drain spacing, which was not adequately addressed before. It follows from previous discussion that the gate-drain surface should be considered as an additional electrode (similar to "body" electrode in many FETs), and its parameters, such as "contact resistance", "saturation current" and "terminal capacitance", or equivalents, must be carefully designed.

First of all, the switching time T must satisfy the RC time $$T > \varepsilon \cdot gm \cdot \left(\frac{V_B}{I_{ON}}\right)^2 \quad (19)$$

Second, the gate-drain spacing should be large enough to allow the blocking voltage spread over it without reaching close to the breakdown field:

$$L_{GD} >> V_B/F_{BR}$$

Third, the surface must provide enough rechargeable states to support both ON and OFF device conditions:

$$n_{MOBILE-S} > n_{TOT} - \sigma_{SDEP}/q \sim n_{TOT} \quad (20)$$

Fourth, the surface over the depletion region must hold some charge ($\sigma_{SDEP}$) which is a trade-off between the blocking voltage and OFF to ON switching time.

Fifth, the ambient or coating material must support surface recharging current density of Equation (10), especially within 2-6 μm distance from the gate edge.

Sixth, the ambient or coating material must have a resistivity in the direction normal to the surface, less than given by Equation (18).

Seventh, the lateral conductivity of the ambient or coating material must be negligible.

Finally, the driving circuit must be designed in such a way that all the signals changing faster than surface recharge time are filtered out or delayed, to prevent the device from premature breakdown.

Figure 10:
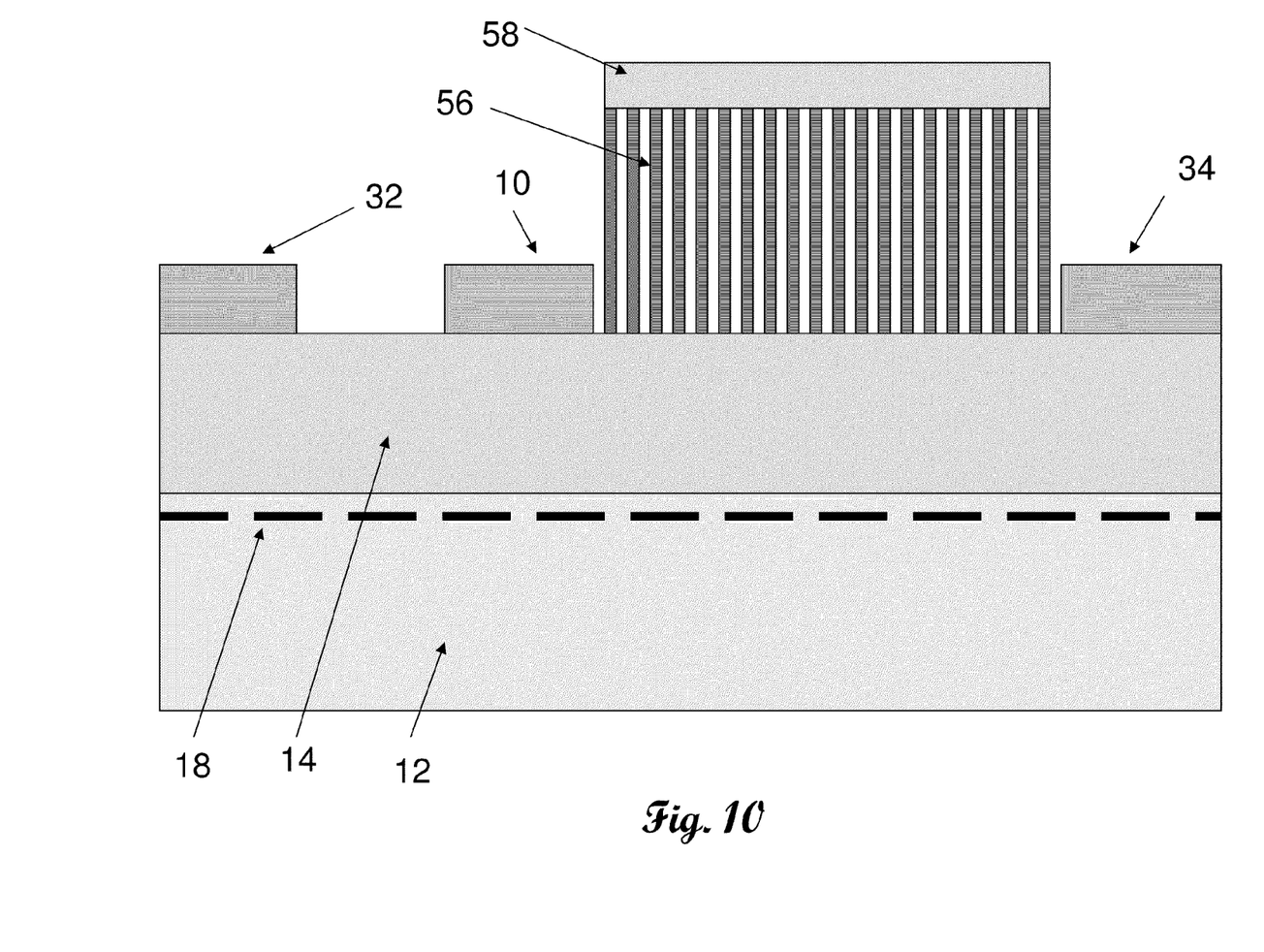
FIG. 10 depicts a schematic device design, according to one of the embodiments, with the means for surface recharge.

As an example of the coating material that may satisfy the criteria of resistivity anisotropy, we can mention the carbon nanotubes forest, porous semiconductor material with low porosity, or a graded structure of metallic or semiconductor walls or stripes connected to some charge reservoir (metal or bulk semiconductor) far enough from the surface, similar to a set of "floating gates" demonstrated in [S.-C. Lee, M.-W. Ha, J.-C. Her, J. Lim, K.-S. Seo, M.-K. Han, An AlGaN/GaN HEMT power switch employing a field plate and a floating gate, Physica Scripta, V. 126, pp. 65-67, August 2006]. Such a design is illustrated by FIG. 10 in which the anisotropic conducting coating 56 is connecting the external charge reservoir 58 to the FET surface.

Figure 11:
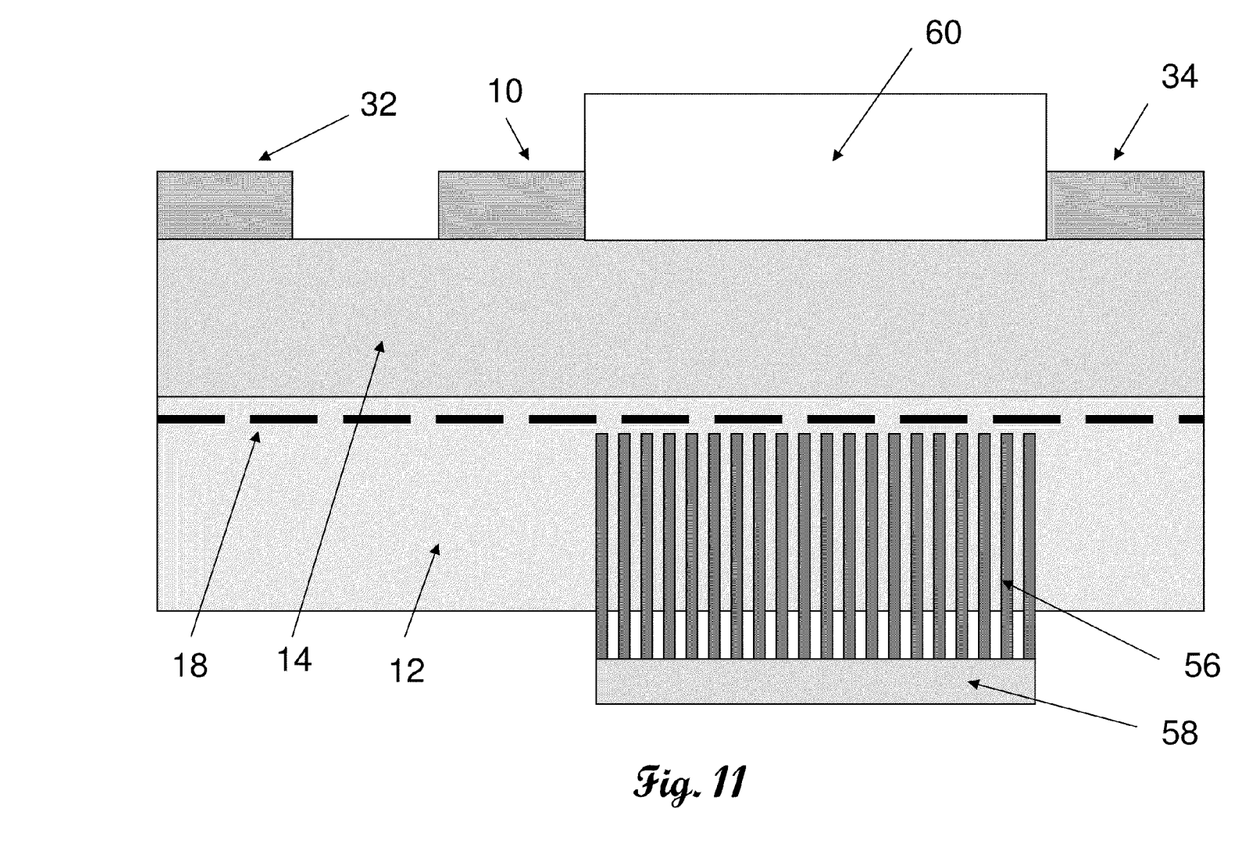
FIG. 11 depicts a schematic device design, according to yet another embodiment, with the means for bulk recharge.

Another embodiment of the present invention is given in FIG. 11 where the recharge path 56 comprising the material with anisotropic conductivity is created within the bulk of the FET buffer 12 and connects the region near FET channel within the gate-drain spacing to the charge reservoir 60 formed in the said buffer 12, and/or between the said buffer 12 and the substrate, and/or within the said substrate; and/or to the external contact connected to the external voltage or current supply.

What is claimed is:

1. A field effect transistor (FET), comprising:
   a first active layer;
   a second active layer disposed on the first active layer such that a lateral conduction channel arises between the first active layer and the second active layer;
   a source electrode formed on a top surface of the second active layer;
   a drain electrode formed on the top surface of the second active layer;
   a gate electrode formed on the top surface of the second active layer between the source electrode and the drain electrode;
   a charge reservoir disposed a distance from the lateral conduction channel wherein the charge reservoir is configured to hold a first electric charge outside a gated portion of the lateral conduction channel; and
   a conducting coating electrically connecting the top surface of the second active layer to the charge reservoir, wherein the conducting coating is configured to supply the first electric charge to the charge reservoir, wherein the conducting coating includes a plurality of metal walls arranged between the gate electrode and the drain electrode connecting the charge reservoir with the tip surface of the second active layer, wherein the metal walls are elongated in a direction perpendicular to a gate electrode-to-drain electrode direction and in a direction normal to the top surface of the second active layer, and wherein the conducting coating is an anisotropic conducting coating that conducts in the direction normal to the top surface of the second active layer.

2. The FET of claim 1, wherein the charge reservoir comprises metal.

3. The FET of claim 1 wherein the first active layer comprises Gallium-Nitride and the second active layer comprises Aluminum-Gallium-Nitride.

* * * * *